United States Patent [19]
Culp

[11] Patent Number: 5,283,497
[45] Date of Patent: Feb. 1, 1994

[54] ELECTROTILTABLE MATERIAL (TILTER)

[75] Inventor: Gordon W. Culp, Van Nuys, Calif.

[73] Assignee: Rockwell International Corporation, Seal Beach, Calif.

[21] Appl. No.: 833,228

[22] Filed: Feb. 10, 1992

[51] Int. Cl.⁵ ........................................... H01L 41/08
[52] U.S. Cl. .................................... 310/328; 310/333
[58] Field of Search ................ 310/328, 333, 358, 359

[56] References Cited

U.S. PATENT DOCUMENTS

| | | | |
|---|---|---|---|
| 2,928,068 | 3/1960 | Samsel et al. | 310/334 |
| 2,928,069 | 3/1960 | Petermann | 310/26 |
| 2,956,184 | 10/1960 | Pollack | 310/369 |
| 3,168,623 | 2/1965 | Petermann | 310/330 |
| 4,322,837 | 3/1982 | Mickleson et al. | 310/335 |
| 4,375,042 | 2/1983 | Marcus | 310/357 |
| 4,460,841 | 7/1984 | Smith et al. | 310/334 |
| 4,736,132 | 4/1988 | Culp | 310/333 |
| 4,928,030 | 5/1990 | Culp | 310/328 |
| 4,961,252 | 10/1990 | Hsu et al. | 310/359 |
| 4,999,536 | 3/1991 | Toda | 310/323 |
| 5,087,852 | 2/1992 | Culp | 310/323 |

FOREIGN PATENT DOCUMENTS 0005376 1/1989 Japan ................................... 310/83

Primary Examiner—Steven L. Stephan
Assistant Examiner—C. LaBalle
Attorney, Agent, or Firm—H. Fredrick Hamann; Harry B. Field; Steven E. Kahm

[57] ABSTRACT

Tilters 2, are made of an electrotiltable material comprising an electroshearable material having a unidirectional gradient of responsivity, such as piezoelectric ceramic. Responsive to an activating electrical signal, tilters 2, tilt surfaces 26, with large side strain and negligible side stress. Forcible tilt provides forceful positioning of objects such as rollers, optical elements, and fluids. Tilting combined with a normal force of traction 16, forcefully moves a roller 12. Rollers pass tilting power to objects 14, in tractive contact such as a motor shaft 14. Alternating activation sense and tilting gradient 10 giving zero tilt at support surfaces 7, provide rigidity with negligible stress. Other embodiments use tilt to position optical elements, vary the flow resistance of fluid in a duct, and bunch charged particles. The actuator's tiltable surface 26 has an optical or acoustic element 52 attached for changing the angle at which radiation interacts with the element. A variant having tilt position sensors constitutes an accurate angular accelerometer.

39 Claims, 2 Drawing Sheets

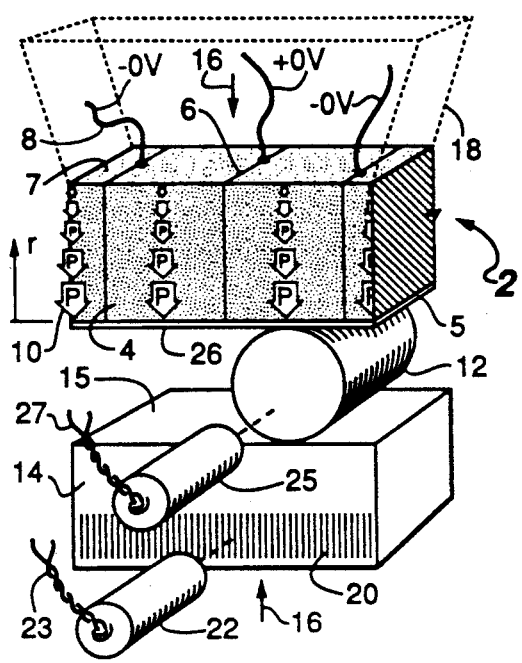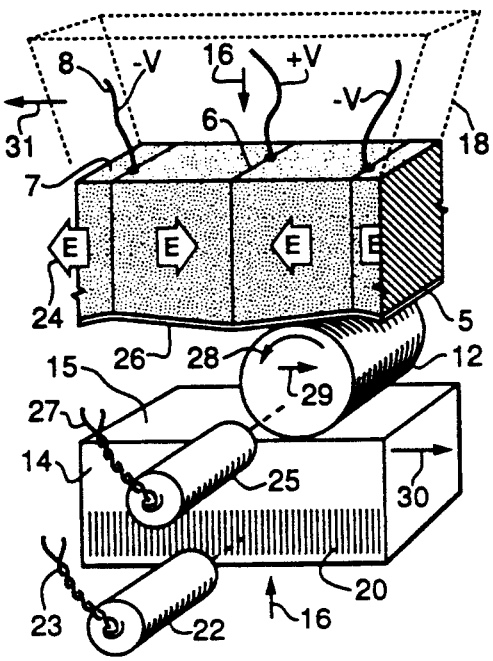
*Fig.1*  *Fig.2*
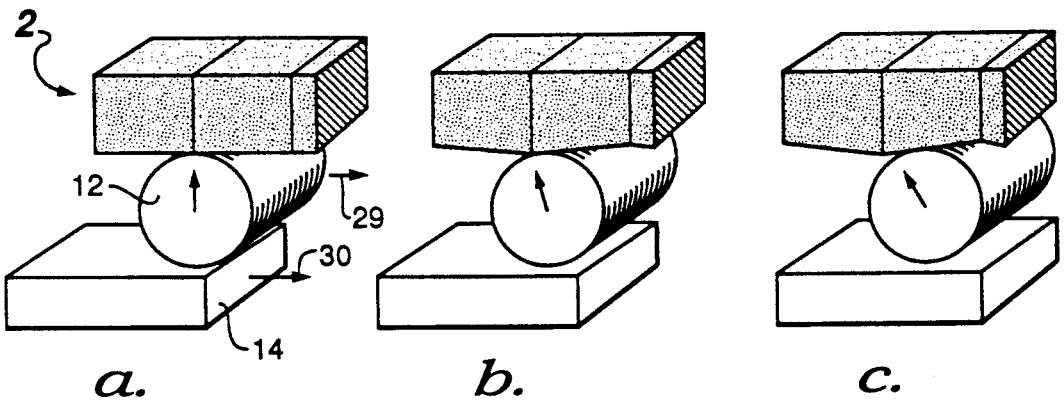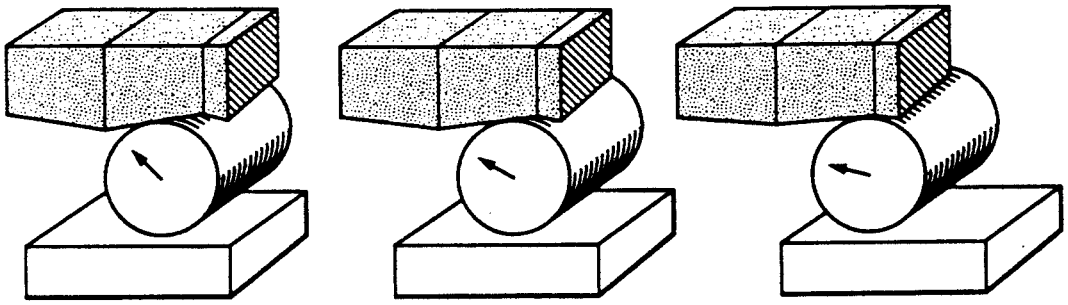
*Fig.3*

ELECTROTILTABLE MATERIAL (TILTER)

FIELD OF THE INVENTION

The present invention is generally directed toward actuators and more specifically to tilting electrodeformable actuators having a unidirectional-gradient electroshearable material.

BACKGROUND OF THE INVENTION

Referring to U.S. Pat. No. 4,736,132, Piezoelectric Mirror and Grating, issued 5 Apr., 1988, described are optical positioning devices comprising piezoelectric body segments with surface portions that rotate by mechanical shear in response to an applied electric potential. Piezoelectric segments of this device shear uniformly because piezoelectric segments are uniformly polarized. Whole body rotation requires support of shear body segments by an extension of an electrode, usually the central electrode. Such support is appropriate for the relatively small forces imposed by the self-weight of each piezoelectric segment and of the optical element portion attached thereto, but is not appropriate for the relatively large forces pertinent to industrial actuators and motors.

Referring to U.S. Pat. No. 4,928,030, Piezoelectric Actuator, issued 22 May, 1990, and U.S. Pat. No. 5,043,621 issued 27 Aug., 1991, described are shear piezoelectric devices that forcefully actuate in a direction parallel to the direction in which one shear face translates relative to an opposite shear face. Surface portions of piezoelectric shear body segments that rotate in the act of shearing are not used other than to provide the mechanical compliance needed for shear deformation. The shear modulus of most ferroelectric ceramic piezoelectric materials is lower than all other moduli.

Referring to Applicant's pending patent Biaxial Transducer, Ser. No. 07/726,441 filed 2 Jul., 1991, described are methods of providing relative strain with negligible stress in the plane between bonded or integrally manufactured bodies, for example, the junction between a shear piezoelectric member and a thickness-mode piezoelectric member. The disclosure teaches methods of varying the piezoelectric shear responsivity radially from an axis and linearly with distance from the axis. Also taught are methods of achieving radially varying responsivity within a piezoelectric shear segment using heat gradients, radiation gradients, material properties gradients, and electrodes having nonhomogeneous electrical properties.

Referring to Applicant's pending Ser. No. 07/708,643, Twisting Actuator (Twister), filed May 31, 1991, described therein are means of providing rotation of a broad surface of an electrodeformable body about an axis parallel to the broad surface by the use, among others, of a radial gradient of responsivity, that is clearly distinct from the linear responsivity gradient of the present invention. Also taught in Applicant's pending 07/803,804 filed Dec. 9, 1991, a Division of 07/708,643, is the use of position sensors to measure a composite of coacting angular and linear accelerations acting on the broad surface, this measurement being clearly distinguished from the measurement of angular acceleration alone by the present invention.

Referring to Applicant's pending patent DC Traveling Wave Motor, Ser. No. 07/492,152 filed Mar. 13, 1990, will issue Feb. 11, 1992 as U.S. Pat. No. 5,087,852, described is a direct current traveling wave motor using face shear waves of a piezoelectric lining of the stator. Waves are generated by the enhancement of electric field intensity due to the presence of rollers in rolling contact with the piezoelectric lining. The slope of a shear wave is highest in the region of the highest field intensity. Rollers therefore roll "downhill" on the locally sheared lining faces, and by traction through radial compression affect shaft rotation. Large traveling waves require thick piezoelectric material, and concomitant high activation potentials. Novelties of the present invention will be shown to concentrate lower potentials by means of electrodes, thereby achieving relatively high electric field intensities which elicit correspondingly larger mechanical wave amplitudes.

OBJECTS OF THE INVENTION

The primary object of the Electrotiltable Material (tilter) is the forcible tilting of the surface of a material, about an axis of the surface that is perpendicular to the direction of the unidirectional-gradient in the electroshearable material, in response to an applied activation signal.

A further object of the tilter is the forcible tilting of a surface with zero stress and large strain at interfaces between two or more tilters bonded together and oppositely activated.

Another object of the tilter is the forceful positioning of an object, such as a motor shaft, by rolling traction induced by a tilter.

Other objects are:
linear forceful positioning of one or more rollers in rolling contact with an object, thus moving and positioning the object;
rotary forceful positioning of one or more rollers in rolling contact with an object, thus moving and positioning the object;
positioning entailing no friction;
relatively high electrical and mechanical efficiency;
high speed of positioning;
unlubricated operation and activation in a vacuum without contamination;
uncooled operation;
obviation of conventional bearings;
operation in zero and microgee environments;
operation as a converter of mechanical to electrical energy (generator);
operation in hostile environments;
obviation of sliding electric commutators;
operation by a wide variety of electrical power types;
tilting a radiation interactive surface, where said radiation includes light, electromagnetic radiation, acoustic waves, fluid flow, plasma and bunched particles;
accurate measurement of angular acceleration;
movement of electrostatic charges;
fluid flow resistance control;
and valves for accurate control of fluids.

BRIEF DESCRIPTION OF FIGURES

FIG. 1 is a perspective inactivated view of a linear embodiment of the tilter.

FIG. 2 is a perspective activated view of a linear embodiment of the tilter.

FIGS. 3(a)–(f) are a six-part animated sequence of action of the apparatus of FIG. 2.

DETAILED DESCRIPTION

Figure 4:
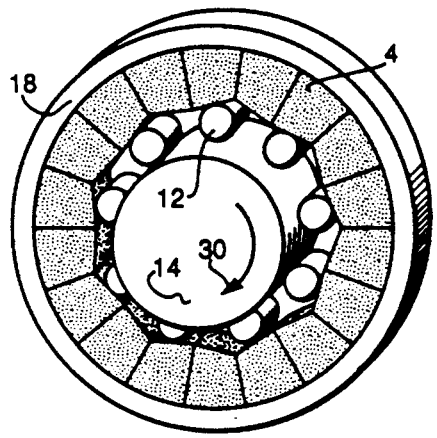
FIG. 4 is a perspective view of a rotary motor embodiment of the tilter.

Referring to FIG. 1, shown is a perspective view of the quiescent (electrically inactivated) state of a linear actuator application of the electrotiltable material, comprising an electrotiltable actuator body generally indicated 2, support means 18 phantomed for clarity, roller 12, and forcibly positioned object 14. The actuator optionally includes position sensing means 22, 25.

The electroshearable actuator body 2 further comprises electrotiltable body segments hereinafter referred to as tilters 4, separated by electrodes 6. In this example embodiment, tilters 4 are made of electrotiltable material that is piezoelectric and having a unidirectional gradient of electroshear parallel to film electrodes 6. Although described in the context of, but not limited to piezoelectric materials as an example, it is understood that tilters are made of electrodeformable material that causes forcible deformations similar to those obtained piezoelectrically.

Continuing with the piezoelectric example, each tilter 4 is polarized P in the direction indicated by arrows 10, the sizes of the arrows indicating the variation of responsivity with distance from tilting surfaces 26, and directions of arrows indicating the direction of the unidirectional gradient of responsivity. Electrodes 6 between tilters 4 are connected to separate sources of variable electric potential (omitted for clarity) by leads 8. The electrotiltable actuator body 2 is affixed to support means 18 by bonding or integral construction at surface 7 of the support means. The embodiment illustrated uses electrically non-conducting roller 12 and electrically non-conducting support means 18. Optional embodiments include one or more insulating sheets, for example insulative coating 5 on tilting surfaces 26, and between electrotiltable actuator body 2 and support means 18, allowing construction using electrically conducting materials such as metals, cermets and the like. Support means 18 is considered fixed in space while positioned object 14 and roller 12 move relative thereto. Tilting surface 26, roller 12, and traction surface 15 of object 14 are in tractive contact by dint of normal forces 16. Positioned object 14 is constrained to translate in direction 30 (FIG. 2) parallel to the rolling direction 29 of roller 12. Sensor 22 provides position signals related to the position of object 14 through leads 23 to sensor signal conditioner 36 (FIG. 7) and then to controller 31. One sensor embodiment uses fiducial marks 20 in the form of an optical grating. Roller position sensor 25 provides a signal indicative of the position of roller 12 through leads 27 to sensor signal conditioner 38 and then to controller 31. Sensor 25 can indicate the times of passage of the edges of roller 12.

FIG. 2 illustrates activation of the apparatus of FIG. 1 by positive voltage $+V$ and negative voltage $-V$ applied to leads 8. The potentials fill tilters 4 with electric field intensity E between film electrodes 6 in directions indicated by arrows 24, perpendicular to the planes of electrodes 6. Again using the piezoelectric example, in each tilter 4 the electric field E and the direction of unidirectional polarization gradient P are therefore perpendicular. The polarization and the electric field, acting in concert, induce a gradient of shear deformation in tilters 4, causing tilting surfaces 26 to change slope. Predetermined electric potentials cause alternating slopes of the tilting surface, the causal traction surface in contact with roller 12 that forces the roller to rotate in direction 28 and thus move in direction 29, thereby forcing object 14 to move in direction 30 by rolling traction. As object 14 proceeds in direction 30 in the figure, potentials applied to leads 8 are adjusted so that the slope of the tilting surface perpetually favors further positioning in the desired direction.

The slope is smoothly adjustable from zero slope to maximum slope by adjusting the applied potentials. The force is proportional to the slope and to the normal force. The speed is proportional to the rapidity with which potentials are changed. Mechanical power is proportional to the force and to the speed.

When the order and timing of the potentials applied to leads 8 are reversed, the tilt slopes are reversed, causing object 14 to translate in the direction opposite that shown in the figure.

It should be noted that adjoining tilters are controlled to have opposite slopes and have common side surface contact areas which shear with equal magnitudes, thereby eliminating contentious stress while allowing relatively large strains. It is emphasized that tilters that are not cooperatively activated relegate a substantial portion of the electromechanical transduction to internal stress that may cause failure of a device by fatigue, if not by outright rupture.

Referring to FIG. 3, shown is a six-part animated sequence of the action of the apparatus of FIG. 2. An arbitrary cycle begins at position 3a when roller 12 is at the junction between two tilters at a time when there is zero slope on the tilting surfaces. The clock hand on the end of roller 12 indicates relative rotary position during the sequence. Position 3a reflects ongoing previous motions 29 and 30 of roller 12 and of object 14, respectively. At positions 3b and 3c, potentials have risen on the tilter electrodes to change the slopes of the traction surfaces, thus continuing rolling of roller 12 and moving of object 14. At position 3d, potentials have increased to approximately their maximum magnitudes and the tilting traction surface slopes are maximum. At positions 3e and 3f, potentials are approaching minimum values, tilt slopes approach minimum values, ending a cycle with the beginning of a new cycle at position 3a.

Mechanical actions are shown greatly exaggerated in the figures for clarity. Although only one or a few rollers are illustrated, the power delivered by a device is proportional to the number of rollers used because the total power is the sum of the power contributed by each roller. Tilters are in practice relatively thin in the direction of the applied electric field (FIG. 2) relative to their broad dimensions. There are usually many segments within the projected width of a single roller or other motivated object. The width of rolling contact between roller 12 and tilting surface 26 is less than the width of tilter 4.

Referring to FIG. 4, shown is a perspective end aspect of a rotary embodiment of the present invention, comprising positioned object 14, in this case a rotatable shaft, rollers 12, tilters 4, and support means or housing 18. The motor of FIG. 4 is shown rotating shaft 14 in direction 30. Position measuring sensors and electrical connections are omitted for clarity.

Figure 5:
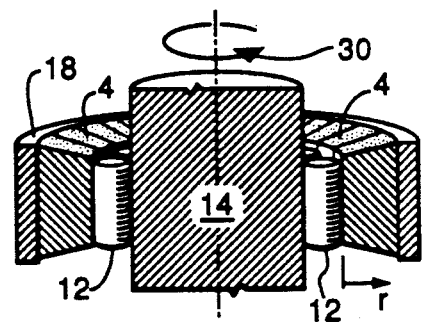
FIG. 5 is a cut-away perspective view of the apparatus of FIG. 4.

Referring to FIG. 5, shown is an oblique section of the motor of FIG. 4, indicating the relationships between components. Also shown is the direction of the unidirectional electroshear gradient of the piezoelectric exemplary embodiment, indicating decreasing responsivity "a" in direction "r."

Figure 6:
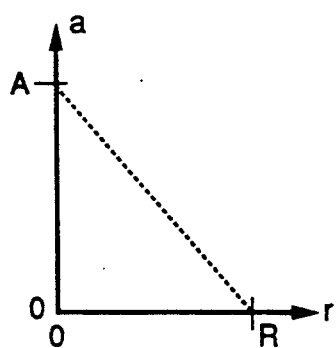
FIG. 6 is a graph of activation parameters that vary with distance from the tilting surface.

Referring to FIG. 6, graphed is responsivity "all as a function of distance "r", in which "r" is given more than one meaning depending on the context of the following description. Responsivity has a maximum value, A, near the traction surface (26, FIG. 1) and decreases linearly to zero responsivity at the location, R, at the supported surface (7, FIG. 1). Since responsivity is made zero at supported surface 7, no tilting occurs in the attachment plane to support means 18, even when tilting surfaces 26 are fully tilted, as clearly illustrated in FIG. 2. In addition to the aforementioned obviation of bond stresses between adjacent tilters, the absence of tilt at support surfaces 7 also provides the strength and rigidity expected of a solid actuating body without stress.

Figure 7:
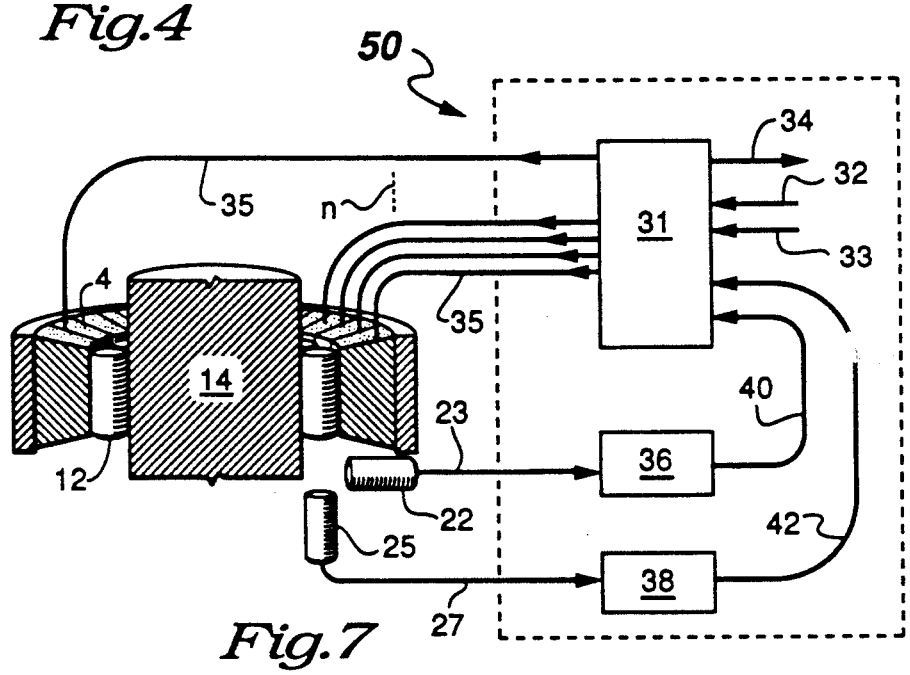
FIG. 7 is a schematic of an electrical activation system of the tilter.

Referring to FIG. 7, shown schematically is an electrical activation system for the rotary motor of FIG. 5, generally indicated 50, for operation of apparatus using the electrotiltable material of the present invention. Activation system 50 comprises controller 31 and sensor signal conditioners 36, 38. Controller 31 includes input ports for activation instructions 32, electrical power 33, and status data output 34. Sensors 22 and 25 provide respective position signals to signal conditioners 36 and 38 by way of respective connections 23, 27. Signal conditioners 36, 38 provide respective position signals 40, 42 to controller 31. Controller 31 compares positions with those included in the activation instructions 32, any error being compensated for in controller 31 by adjustment of the n drive signals 35. Drive signals 35, including timing, amplitude, and slew rate, are adjusted by controller 31 in a manner predetermined to produce efficient and smooth operation of the device.

Alternate embodiments of the present invention have additional electrotiltable actuator bodies attached to the positioned object or shaft so as to offer two traction surfaces for each roller, thereby doubling the force of actuation. Rotary embodiments with both stationary and rotating tilting bodies require more complicated controlling means, and require electrical commutation. Stator-only embodiments wherein the size of segments is increased slightly, to effectively provide the actuating force otherwise available from multiple tilting body embodiments, are therefore preferred.

The preferred control loop method, implicit but not evident in the figures, uses electric signals from the tilters themselves. For example, the exemplary piezoelectric tilters are electromechanically reciprocal, converting electrical energy to mechanical work and the converse. The piezoelectric tilters therefore respond electrically to an external force applied to the tilting surface, such as the force of passing rollers. Roller force responses are superimposed on the applied potentials of the drive signals in leads 35 during operation. Roller electrical responses are extracted by controller 31 for use in feedback signals that enable more efficient system operation.

The use of electromechanically reciprocal embodiments of the tilter allows operation of a diverse assortment of apparatuses such as generators by converting mechanical into electrical energy. By way of example, forceful action in direction 30 (FIG. 2) provided by an external mechanical power source generates bipolar alternating electrical potentials in leads B. Frequency of produced electrical power is proportional to roller speed, roller spacing, and tilter spacing along the rolling path. Potential produced is proportional to normal force 16 and the effective responsivity of the tilter material. The power produced is proportional to the potential and to the frequency.

There are many ways to vary the responsivity, a, with the distance r when producing gradient electroshearable materials, some of which are disclosed in Applicant's copending application Ser. No. 07/708,643 filed May 28, 1991, entitled Twisting Actuators, which is incorporated herein by reference.

A gradient shear piezoelectric body segment may be made by a method wherein the body has a maximum uniform piezoelectric shear sensitivity. The segment is then subjected to a linear gradient of radiation intensity, a, that varies with R as in FIG. 6, and for a predetermined time, resulting in a linear variation of its shear responsivity.

In another method, a piezoelectric body segment may be made having maximum uniform piezoelectric shear responsivity and is then subjected to a linear temperature gradient, a, as in FIG. 6 for a predetermined time, resulting in linear shear sensitivity.

Using another alternate manufacturing method, piezoelectric shear segments can be made with maximum uniform shear sensitivity and are assembled with graded film electrodes. The electrical conductivity, a, of each graded electrode varies with R as in FIG. 6. Electrode edges at the supported body surface, having zero conductivity, may be electrically grounded for stability, allowing support means or housing 18 to be made of electrically conducting material. In practice, graded electrode impedance and concomitant electric field intensity distribution are complex rather than purely resistive. Therefore the gradient of electric field intensity is linear only with a prescribed frequency content of electrical activation.

An additional manufacturing method treats uniformly maximally shear sensitive ferroelectric segments with a non-uniform electric polarizing field intensity, resulting in linearly varying shear sensitivity. Additional alternate methods comprise various combinations of the aforementioned methods.

For a more detailed discussion of how to make piezoelectric materials with varying polarization or electric field magnitudes that depend on position, see Applicant's application titled Biaxial Transducer, Ser. No. 07/726,441 filed Jul. 2, 1991 which is made a part hereof and hereby incorporated to this application by reference.

A further use of the electrotiltable material is the positioning of optical elements such as mirrors and gratings. Optical elements attached to the tilting surfaces provide angular positioning while retaining the aforementioned benefits of an essentially solid structural unit with durable support means, an improvement of Applicant's related art U.S. Pat. No. 4,736,132 titled Piezoelectric Mirror and Grating, issued Apr. 5, 1988, which is incorporated herein by reference.

Figure 8:
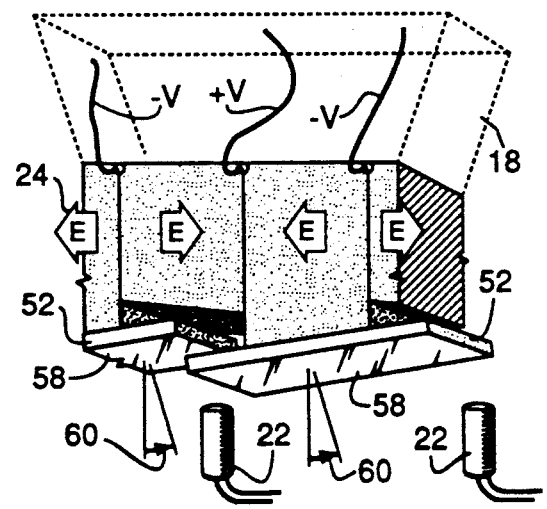
FIG. 8 is a perspective view of the tilter with tiltable radiation interactive surfaces attached and proximate tilt position detectors constituting an angular acceleration sensing embodiment.

Referring to FIG. 8, shown in perspective portion view is an activated radiation interactive embodiment of the tilter similar to that described with respect to FIG. 2, comprising short tilters adjacent to long tilters, support means 18, and radiation interactive elements 52 attached to the long tilters. The short tilters provide stressless lateral support for the long tilters. Radiation interactive elements 52 of the illustrated embodiment are extended to cover the preponderance of the tilting surface area. When deactivated (potentials as in FIG. 1), radiation interactive elements 52 lie in a plane in embodiments benefiting therefrom.

Radiation interactive elements 52 have radiation interactive surfaces 58 which are impinged by radiation. Radiation includes nonexclusively, in accordance with a particular application, electromagnetic radiation, coherent light as from a laser, infrared and ultraviolet radiation, radio waves, microwaves, millimeter waves, moving fluid, fluid having wavelike perturbations, plasma, bunched particles and acoustical waves. Interaction includes, depending on the particular application, a combination of focusing, bunching, valving, turbulating, direction changing, absorption, reflection, refraction, and diffraction predicated on the selection of material and morphology of the radiation interactive surface 58. When activated with electrical potentials of a first polarity as illustrated in FIG. 8, radiation interactive elements 52 are tilted in directions 60, while application of opposite polarities tilt elements in the direction opposite directions 60. Bipolar-responsive electrotiltable materials, such as those exemplified by the piezoelectric gradient shear materials, provide twice the angular tilt as materials responsive only to monopolar activating signals.

At each time instant, the long tilters 4 can be tilted at the same angle, such that all interactive elements 52 will interact with the incoming radiation at the same angle. For embodiments in which each interactive radiation element 52 is a stripe of a grating, the tilting provides angular adjustment of the stripes.

A variant (not illustrated) comprises an electrodeformable body similar to that of FIG. 2 wherein tilters are of equal height and the tilting surface 26 is clothed in conterminous radiation interactive elements such as strips of mirror or of grating. This variant tilts even numbered interactive segments in one direction and odd numbered segments in the opposite direction, providing a blazed grating with electrically adjustable blaze angle. In the inactivated state, the radiation interactive surfaces 58 lie at a predetermined angle relative to the general tilting plane, this angle including the zero angle such that radiation interactive elements lie in a plane when inactivated, thereby changing a grating into a plane mirror. The fully clothed variant advantageously strengthens the apparatus by fully supporting interactive elements, obviating cantilevered element edges as shown in FIG. 8. Tilters having uniform height benefit from full mutual side support, and interactive surfaces lie in a plane in the inactivated state, allowing vigorous grinding, polishing, and coating with reduced likelihood of damage. The electrically adjustable blazed grating thus constituted provides a relatively shallow tilt angle in the range of zero to 20 milliradians of angle, providing practical blazed grating performance in applications requiring grazing incidence such as very high power laser resonator optical elements. Further, application of separate and distinct electrical potentials to the electroshearable body segments provides a slowly varying spatial distribution of blaze angle and element tilt while incurring negligible internal stress.

Yet another embodiment of the tilter uses a single tilter such as the long element of FIG. 8, having position sensors 22 proximate tilting surface 58. Subjecting element 52 to angular acceleration about the axis of tilt causes inertial tilting of surface 58. One of the sensors 22 detects a lesser distance to surface 58 while the other sensor detects a greater distance. Measurement of the difference of the distances, given a priori knowledge of the body dimensions, the body elastic properties, and the magnitude of the angular acceleration about the tilt axis, provides means of calibrating the apparatus as a uniaxial angular acceleration transducer.

In one embodiment of the tilter as an angular acceleration sensor, electrical signals are applied to the tilter to maintain the amount of tilt in the inactivated state, equivalent to maintaining the measured position difference at a null value. Measurement of the value of the electrical potential applied to the tilter body that nulls tilt, subsequent to calibration with a predetermined range of angular accelerations, provides a measurement coresponding to an angular acceleration of interest. This preferred measurement method provides advantageous accuracy because the tilter remains in the unstrained state, obviating nonlinearities in both the tilting responsivity and in the distance measurements made by sensors 22.

The accuracy of measurement of angular acceleration increases with increasing sensitivity of position sensors 22. Preferred position sensing means cause quantum electron tunneling between sensors 22 and surface 58 (FIG. 8). Because the electron tunneling current varies with a large numeric power of the distance between sensor 22 and surface 58, the position of surface 58 is maintained at the null position with certainty bounded by a fraction of an atomic distance, thereby providing adequate sensitivity for a variety of inertial reaction force measurement applications. In addition, because the null tilt position is maintained during measurements of angular acceleration, the gap, and therefore the expected tunneling current also remains constant, avoiding the effects of the nonlinearity of tunneling current with position.

One method of making tilters to measure angular acceleration consists of epitaxially depositing the electrotiltable material and electrodes, depositing an insulating support layer, then depositing position detectors 22 proximate surface 58. Deposition also includes electrical connections 23 to position detectors 22 and to the electrotiltable body.

In a variant accelerometer embodiment of the tilter, support 18 of the tilter is a multiaxis positioning actuator such as Applicant's previously described Twisting Actuator Accelerometer application filed Dec. 9, 1991 Ser. No. 07/803,804. A positionable support provides means of electrically, secularly adjusting the average distance between surface 58 and position detectors 22 to compensate for errors in manufacturing, to correct errors due to drift of position detectors 22, and to correct for such other changes, familiar to those versed in transducer-arts, which erode system accuracy and sensitivity.

The embodiment variant having the positionable support means 18 provides means of cancelling the effects of linear acceleration in any direction relative to the direction of shear gradient. For example, linear accelerations normal to the tilting surface, such as downward on surface 58 (FIG. 8) reduces the distance between surface 58 and sensors 22. In the tunneling current sensor embodiment, the linear acceleration reduces the tunneling currents of both sensors. Algorithms responsive to the inherent nonlinearity of tunneling current with distance provide means of returning surface 58 to its null (vertical in FIG. 8) position by applying the appropriate signal to positioning support means 18. This latter step provides unambiguous measurement of angular acceleration, and also provides, using a measurement of the corrective signal applied to support means 18, means of measuring the linear acceleration. Those versed in accelerometer arts will readily appreciate the ease with which tilters are embodied as multi-axis inertial measurement units (IMUs).

The Applicant has a copending application for an accelerometer entitled Twisting Actuator Accelerometer Ser. No. 07/803,804 filed Dec. 9, 1991, which is incorporated herein by reference.

In general, ferroelectric piezoelectric materials have an elastic rigidity that is inversely proportional to shear sensitivity. As shear sensitivity is changed along the gradient direction, a layering method allows tailoring of elastic properties such that each segment can better sustain operating stresses while providing a prescribed gradient of responsivity. Tilters, as segments of a rotary actuator and motor embodiment, are larger at supported surfaces 7 than at tilted surfaces 26. Therefore, structural segment strength that is anisotropically decreasing in a radial outward direction favors more efficient operation without diminishing whole-segment load bearing ability, while reducing peak activating signal magnitude with a given value of tilt.

The volume of a gradient electroshearable body is independent of the potential applied to it. The thickness of the segments in the direction of electric field E (FIG. 2) does not change during excitation, allowing compressive segment packing in a support means such as a housing (18, FIG. 3). Net segment measurement parallel to polarization direction (10, FIG. 1) does not change, allowing constant average spacing of rolling traction surfaces during operation. The measurement in a direction parallel to a roller axis does not change, thereby avoiding bonding stress at the supported surface 7. This constant measure also precludes axial rubbing at contacts between rollers and the traction surface.

Referring to FIGS. 1 and 2 (disregarding the rollers 12 and the object 14), multiple unidirectional-gradient electroshearable material segments 4, having tilting surfaces 26, can constitute the inner surface portion of a fluid duct (support means 18), in which a fluid flows. The tilting surface, when quiescent, presents to the flow a smooth surface which does not hinder the flow. When the tilters are activated, the tilted surfaces initiate more turbulent flow of the fluid, thereby increasing flow resistance with increasing tilt angle. As previously described, segments do not change volume when activated, allowing average fluid duct cross section area to remain invariant with tilt angle. However, the inward facing apex edge of a conterminous pair of tilted surfaces occludes a portion of the duct area, further increasing the resistance to flow.

In another embodiment a segment width may be predetermined to excite periodic turbulation in a selected fluid having a prescribed velocity. Conversely, a fluid having predetermined periodic energy content may relinquish a portion of its energy in the conversion from ponderomotive to electromotive by an array of gradient electroshearable segments acting as a generator or as a sensor. The latter may be responsive to a narrow span of frequencies, such as predetermined critical frequencies in apparatus known to evince chaotic behavior.

Referring to FIGS. 1 and 2 (disregarding the roller 12), the tilting surface 26 could be placed close to an object such as a duct or tube wall 15. A fluid flowing in direction 29 between tilting surface 26 and wall 15 can be slowed or stopped by tilter 26 being activated such that an apex comes close to or touches wall 15.

In another embodiment, two tilters facing one another and having a fluid flowing between their proximate tilting surfaces can both be activated such that their apexes approach or touch one another, thus acting to reduce or stop the flow of a fluid.

Electrode edges of the activated gradient electroshearable array tilting surface have alternating polarities that act on bunched charged particles, such as bunched electrons in a free-electron laser. Two closely facing tilting surfaces provide alternating-direction electric field intensity known to effect bunching. Spatial frequency in the beam direction is effected by assembling segments of prescribed width, while the electric field intensity is remotely electrically adjusted by varying the potential magnitude on each electrode, in accordance with predetermined effect of tilt edge apex spacing and applied potential, on the collective effects on the quality of bunching.

Piezoelectric ceramics, typically oxides of lead, zirconium, titanium and barium are known for relatively high compressive strength but relatively low tensile strength, the ratio being as high as 100:1. During rolling, and due to the applied contact force needed for rolling traction, stresses borne by the piezoelectric segments are largely compressive. Interference assembly in the support means (housing) also compresses the tilting body annularly. The preferred assembly method follows the teaching of the roller bearing art wherein all rollers are inserted to one side between the electroshearable body and the shaft, then progressively moved around until equally spaced. Repositioning of relatively tight rollers is aided by differential heating and cooling of components.

Preferred materials of the unidirectional-gradient electroshearable material are selected so that the contact force remains within prescribed bounds in a predetermined temperature range. The ideal choice of materials results in a zero sum of products of linear thermal expansion and length, giving constant contact force throughout the temperature range, at least when thermal gradients are absent. Selection of device materials, all having very small thermal expansion, allows predetermined temperature differences and temperature gradients of components while maintaining contact force within prescribed bounds.

Residual stress due to differential thermal expansion is compensated for by incorporating into the actuator an element of Biaxial Transducer, a stress ameliorating element described in Applicant's copending application Ser. No. 07/726,441, filed 2 Jul., 1991. The biaxial transducer provides surface dilatation by an electrically controlled circular gradient shear. Dilatation accommodates substantial strain without incurring internal stress in the plane of the bond between the actuator of the present invention and the biaxial transducer.

Illustrated embodiments show exposed shear bodies in FIGS. 3, 4, 5, 7, and 8. Alternate embodiments include shear body surfaces coated with electrical insulating materials such as layer 5, in FIGS. 1 and 2. Coating materials having elastic limits equal to or greater than those of the shear body are preferred to eliminate cracking and delamination. Coatings comprising ceramics such as the high strength compositions used in automobile engines are preferred for traction surfaces, particularly when conducting rollers are used. Coating prevents electrical leakage during operation in conducting media such as gas at low pressure, conductive liquids such as seawater, or fluids containing conductive particles. Coatings also distribute rolling contact stress from maximum stress at the contact surface to a substantially lower value in the tilting body near the interface of body and coating. Piezoelectric ferroelectric materials supply a peak-peak edge angle in the range of zero to 20 milliradians. Although most embodiments of the peristaltic shear motor are self starting, after an extended quiescent time, roller contacts may be temporarily deformed. Ancillary starting means are well known to those versed in the electromechanical arts and may be used herewith.

Mechanisms that shorten life of the present invention are few and relatively benign. Illustrated embodiments show the use of rollers, whereas balls result in equivalent operation. Rotary embodiments with balls use rotor and stator grooves (not illustrated) as ball guides. However, balls cause a concentrated stress of contact, also referred to as a Hertzian contact, that typically has a small circular or elliptical contact area. Hertzian contacts are characterized by high stress and low stiffness. The rigidity of the Hertzian contact is proportional to the normal force of contact taken to a relatively large numerical power. At low normal force, rigidity is low. In many applications of rolling balls such as ball bearings, rigidity never reaches desirably high values before contact stress rises above those values that cause short life or outright destruction of the bearing.

In contrast to the rolling ball, the cylindrical roller has a line contact that is not Hertzian. Normal forces are distributed over the relatively large area of the line contact, resulting in reduced contact stress. Rigidity of the rolling line contact is inherently high, even at initial contact under relatively low values of normal force. Rigidity thereafter changes relatively little with increasing normal force. Stress is further reduced by the use of plural rollers, given a predetermined normal force.

Just beneath the line of contact between roller and traction surface, the compressive stress in the piezoelectric material reaches a maximum. Associated with the compressive stress is a shear stress that is approximately equal to one third of the compressive stress.

Rolling element failure is initiated by microsliding and fatigue. Microsliding is the minute relative sliding of portions of the rolling contact surface. The amount of microsliding depends on the deformation in the contact, which in turn depends on the magnitude of the applied normal force and on the curvature of the contacting surfaces. Rollers have measurably longer lives than balls, given a normal force and rolling diameter. Fatigue depends in a complex manner on the normal force and the repetition rate of strain application and removal. Rollers are preferred because a relatively low strain of contact results from a given normal force.

In Applicant's copending application DC Traveling Wave Motor, Ser. No. 07/492,152 filed Mar. 13, 1990, the taught electric field intensity that determines the slope of the sheared piezoelectric liner depends on the radius of the rollers, the slope increasing with decreasing roller radius. In contrast, the present invention determines electric field intensity by actuator body geometry, responsiveness being independent of roller radius. Therefore, the present invention provides the improvement of allowing the use of rollers predetermined to be large enough to relegate rolling contact stress to a value below a prescribed maximum.

Embodiments and variants of the tilter operate more efficiently when lubricants are not used. Bearings in the conventional sense are not used in the present invention because the positioned object, subject to the normal force of traction, is held in a vise-like grip at all times. The rolling contact in combination with high relative rigidity results in constraining the positioned object with greater precision than afforded by any conventional rolling element bearing having customary clearances. Relatively long motors provide complete guidance of rollers because traveling tilts favor movement of a roller to a location entailing reduced potential energy. Short motors use roller stabilizers, also called retainers, familiar to those versed in the rolling element bearing arts.

Piezoelectric shear transducers operate most efficiently when driven with symmetric bipolar signals as taught in U.S. Pat. No. 4,928,030, Piezoelectric Actuator, issued May 22, 1990, and U.S. Pat. No. 5,043,621 issued Aug. 27, 1991. Perpendicularity of applied electric field and polarization directions precludes depolarization in piezoelectric embodiments. In contrast, a relatively small potential antiparallel to the poling direction applied to a thickness or extension mode piezoelectric transducer results in altered polarization. Bipolar electric drive effectively doubles the mechanical response of shear transducers compared to thickness and extension piezoelectric mode devices, these latter being limited essentially to monopolar electric drive. In addition, the piezoelectric coefficient of shear responsivity and the electromechanical coupling factor are generally higher than those of other modes, an aid to more efficient power conversion.

Piezoelectric shear is a two-dimensional deformation, whereas all other known modes of deformation are three-dimensional. Two-dimensional deformation in part allows shear operation at relatively high energy density without excessive heating, thereby precluding forced cooling in most applications. Essentially cold operation is an advantage in vacuum applications such as interstellar space. However, embodiments having forced cooling channels (not illustrated) in one or more components are included in the scope of the present invention.

Although piezoelectric actuators are described as an example embodiment of electroshearable material, any material that forcefully shears in response to electrical activation may be used in variants of the present invention. Magnetostrictive materials, electrostrictive materials, assemblages of rolling conductors, magnetically permeable members and permanent magnets, configured to provide the electromechanical action of gradient piezoelectric shear previously described, functionally replace piezoelectric shear materials. In particular, magnetic gradient electroshearable materials and thermoexpansive gradient shear materials may be used.

I claim:

1. A tilter comprising:
   a unidirectional-gradient electroshearable material having a tilting surface and a supported surface;

film electrodes attached to the unidirectional-gradient electroshearable material said electrodes are parallel to the unidirectional-gradient in the electroshearable material, and apply an activation signal which has an electric field perpendicular to said film electrodes, whereby the electroshearable material responds to the activation signal by shearing in a graded manner from maximum shear at the tilting surface to minimum shear at the supported surface, thereby forcibly tilting said tilting surface about an axis perpendicular to the unidirectional-gradient direction while the supported surface remains stationary.

2. A tilter as in claim 1, wherein said unidirectional-gradient electroshearable material has gradient shear responsivity and the electric field intensity is uniform.

3. A tilter as in claim 1, wherein said unidirectional-gradient electroshearable material has uniform shear responsivity and the electric field intensity is gradient.

4. A tilter as in claim 1 wherein said unidirectional-gradient electroshearable material comprises piezoelectric material.

5. A tilter as in claim 4 wherein said piezoelectric material is ferroelectric.

6. A tilter as in claim 4 wherein said piezoelectric material shears by crystalline state change.

7. A tilter as in claim 1 wherein said unidirectional-gradient electroshearable material comprises magnetic gradient electroshearable material.

8. A tilter as in claim 1 wherein said unidirectional-gradient electroshearable material comprises thermoexpansive gradient shear material.

9. A tilter as in claim 1 wherein said unidirectional-gradient electroshearable material has a body having at least two sides,
wherein a plurality of said bodies are attached having said film electrodes sandwiched between them,
and wherein the bodies are polarized parallel to each other and alternate electrodes have reversed polarity, wherein the bodies shear with equal magnitude at adjoining side surfaces and tilting surfaces tilt with opposite slopes.

10. A tilter as in claim 9 wherein the activation signals are generated in a controller for tilting the bodies to the desired slopes.

11. A tilter as in claim 10 wherein there is a means for sending position data about the bodies to the controller.

12. A tiler as in claim 11, further including a positionable object pressed against the roller, wherein the tilting forcibly positions the object by rolling tractional contact between the roller and the object.

13. A tilter as in claim 12, further including a cylindrical housing containing said gradient electroshearable bodies, said bodies having cylindrically conterminous tilting traction surfaces, the supported surfaces being attached to the housing, wherein the positionable object is a cylindrical shaft.

14. A tiler as in claim 13 wherein the activation signals are generated in a controller for tilting the bodies to the desired slopes for forcing the rollers to move the shaft.

15. A tilter as in claim 14 wherein there is a means for sending position data about the bodies to the controller.

16. A tilter as in claim 14 wherein there is a means for sending position data about the roller to the controller.

17. A tilter as in claim 12, wherein said unidirectional-gradient electroshearable material is reciprocal, providing the conversion of input mechanical energy to electrical power whereby when the object is moved it moves the roller which tilts the tilter thereby generating an electrical output proportional to the force applied to the object.

18. A tilter as in claim 10 wherein the electrodes between activated bodies are displaced, thus moving the electrostatic charge carried by the electrodes with relation to a proximate object responsive to electrostatic force and doing work on said object.

19. A tilter as in claim 18 wherein the electrostatically responsive object is an electron beam which the electrostatic charge on the electrodes deflects.

20. A tilter as in claim 10 wherein the tilting surface has edges such that one edge is raised and one edge is lowered when the tilting surface is tilted.

21. A tilter as in claim 20 wherein a fluid flows normal to the edges of the tilting surface, the fluid flow resistance is low when the tilting surface has zero slope and the fluid flow resistance increases when the tilting surface slope increases.

22. A tilter as in claim 20 wherein there is a duct wall proximate the tilting surface, wherein alternate edges of the tilting surface extend to the wall when the tilter is fully activated, wherein the fluid flow is regulated by regulating the magnitude of activation.

23. A tilter as in claim 20 wherein there is a duct having a first tilting surface and a second tilting surface where in the first and second tilting surfaces are in parallel proximate planes, wherein a fluid flows normal to the edges of the tilting surfaces, and is regulated by the position of the edges relative to each other.

24. A tilter as in claim 9 further including a roller pressed against the tilting surface, wherein the tilting of the tilting surface forcibly rolls the roller by tractional rolling contact between the tilting surface and the roller.

25. A tilter as in claim 9, wherein said unidirectional-gradient electroshearable material is reciprocal, providing the conversion of input mechanical energy to electrical power whereby a force which tilts the tilting surface will generate an electrical output proportional to the tilting force.

26. A tilter as in claim 9, wherein alternate bodies are of a shorter length between the supported surface and the tilting surface, the longer bodies have radiation interactive surfaces attached to the tilting surfaces which tilt the radiation interactive surfaces to a desired slope.

27. A tiler as in claim 26, wherein the interactive radiation surface extends beyond the tilting surface of the body it is attached to and extends over a portion of the tilting surface of the adjacent body.

28. A tilter as in claim 26, wherein the interactive radiation surface is a reflective surface.

29. A tilter as in claim 26, wherein the interactive radiation surface is a refractive surface.

30. A tilter as in claim 26, wherein the interactive radiation surface is a diffractive surface.

31. A tilter as in claim 26, wherein the interactive radiation surface is an absorption surface.

32. A tilter as in claim 26, wherein the interactive radiation surface is for electromagnetic radiation.

33. A tilter as in claim 26, wherein the interactive radiation surface is for acoustic radiation.

34. A tilter as in claim 1, wherein said unidirectional-gradient electroshearable material is reciprocal, providing the conversion of input mechanical energy to electrical power whereby a force which tilts the tilting surface will generate an electrical output proportional to the tilting force.

35. A tilter as in claim 1, further comprising a position sensor proximate said tilting surface, wherein rotational acceleration tilts the tiltable surface about the axis, which tilting is detected by a sensor and electrotiltably nulled by application of an activation signal the magnitude of which is a measure of the rotational acceleration experienced by the tilter.

36. A tilter as in claim 1, further comprising a position sensor proximate said tilting surface, wherein rotational acceleration tilts the tiltable surface about the axis, which tilting is detected by a sensor and electrotiltably nulled by application of an activation signal the magnitude of which is a measure of the rotational acceleration experienced by the tilter.

37. A tilter as in claim 1, further comprising a position sensor proximate said tilting surface for detecting and measuring rotational acceleration which tilts the tiltable surface.

38. A tilter as in claim 1 wherein said tilting surface is attached to one wall of a fluid duct which is proximate an opposing wall of the fluid duct such that the tilting of the tilting surface regulates the fluid flow.

39. A tilter as in claim 1 wherein a first tilting surface is attached to a first wall of a fluid duct which is proximate an opposing second tilting surface which is attached to a second wall of the fluid duct such that the tilting of the tilting surfaces regulates the fluid flow.

* * * * *